United States Patent
Tanaka et al.

(10) Patent No.: US 6,909,179 B2
(45) Date of Patent: Jun. 21, 2005

(54) LEAD FRAME AND SEMICONDUCTOR DEVICE USING THE LEAD FRAME AND METHOD OF MANUFACTURING THE SAME

(75) Inventors: Shigeki Tanaka, Hakodate (JP); Atsushi Fujisawa, Hakodate (JP); Souichi Nagano, Hokkaido (JP); Tsugihiko Hirano, Hakodate (JP); Ryouichi Oota, Hokkaido (JP); Takafumi Konno, Hakodate (JP); Kenichi Tatebe, Hakodate (JP); Toshiaki Okamoto, Hakodate (JP)

(73) Assignees: Renesas Technology Corp., Tokyo (JP); Hitachi Hokkai Semiconductor, Ltd., Hokkaido (JP)

(*) Notice: Subject to any disclaimer, the term of this patent is extended or adjusted under 35 U.S.C. 154(b) by 0 days.

(21) Appl. No.: 09/904,839

(22) Filed: Jul. 16, 2001

(65) Prior Publication Data

US 2001/0050419 A1 Dec. 13, 2001

Related U.S. Application Data

(63) Continuation of application No. 08/820,228, filed on Mar. 18, 1997, now Pat. No. 6,265,762.

(51) Int. Cl.[7] .................... H01L 23/48; H01L 23/52; H01L 29/40
(52) U.S. Cl. .................................................. 257/734
(58) Field of Search ................. 257/666, 786, 257/678, 734, 735, 736, 737, 738, 739, 740, 741, 742, 743, 744, 784, 773, 774, 775

(56) References Cited

U.S. PATENT DOCUMENTS

| | | | |
|---|---|---|---|
| 4,592,794 A | * | 6/1986 | Davis et al. .................. 156/89 |
| 4,992,628 A | | 2/1991 | Beppu et al. |
| 5,028,983 A | * | 7/1991 | Bickford et al. ............. 357/69 |
| 5,045,919 A | | 9/1991 | Nagaoka |
| 5,072,281 A | * | 12/1991 | Eytcheson .................. 257/666 |
| 5,245,214 A | | 9/1993 | Simpson |
| 5,252,855 A | | 10/1993 | Ogawa et al. |
| 5,510,649 A | | 4/1996 | Adhihetty et al. |
| 5,627,850 A | * | 5/1997 | Irwin et al. .................. 372/43 |
| 5,691,567 A | | 11/1997 | Lo et al. |
| 5,757,082 A | | 5/1998 | Shibata |
| 5,771,157 A | | 6/1998 | Zak |
| 5,818,114 A | * | 10/1998 | Pendse et al. ............. 257/786 |
| 5,905,299 A | | 5/1999 | Lacap |
| 5,907,190 A | * | 5/1999 | Ishikawa et al. ........... 257/795 |

FOREIGN PATENT DOCUMENTS

JP    359105349 A   *   6/1984

* cited by examiner

Primary Examiner—B. William Baumeister
Assistant Examiner—Dana Farahani
(74) Attorney, Agent, or Firm—Antonelli, Terry, Stout & Kraus, LLP

(57) ABSTRACT

A semiconductor device includes a substrate, a semiconductor chip mounted on one surface of the substrate, wherein the semiconductor chip has an integrated circuit and bonding pads formed on a main surface thereof. The main surface of the semiconductor chip has a quadrilateral shape with the bonding pads being disposed along four sides of the main surface. A plurality of conductors is disposed on the one surface of the substrate so as to surround the semiconductor chip along four sides thereof and a plurality of bonding wires electrically connect the bonding pads with tips of the conductors, respectively. A resin body seals the semiconductor chip, the conductors and the plurality of bonding wires. A pitch between adjacent bonding pads increases in a direction toward four corners defined by the four sides of the main surface of the semiconductor chip.

18 Claims, 10 Drawing Sheets

LEAD FRAME AND SEMICONDUCTOR DEVICE USING THE LEAD FRAME AND METHOD OF MANUFACTURING THE SAME

CROSS REFERENCE TO RELATED APPLICATION

This is a continuation of U.S. application Ser. No. 08/820,228, filed Mar. 18, 1997, now U.S. Pat. No. 6,265,762, the subject matter of which is incorporated by reference herein.

BACKGROUND OF THE INVENTION

The present invention relates to a lead frame and a semiconductor device, and more particularly to a technique which is applicable to a lead frame having multi-leads and a semiconductor device using the lead frame.

In the production of a semiconductor device, such as an LSI, more complicated circuits are being fabricated and the number and type of functions are also increasing with improvement in the degree of integration. Because of the ability to provide increased functions, the semiconductor device has come to require more external terminals, and thus, the numbers of pad electrodes provided on a semiconductor chip and the number of leads that form the external terminals of a semiconductor device have increased in a corresponding manner. For example, the number of external terminals has reached the hundreds in a logic semiconductor device. An example of such a multi-lead semiconductor device is a quad flat package (QFP) type semiconductor device. Since a plurality of leads are provided on all four sides of a sealing body for sealing a semiconductor chip in the QFP type semiconductor device, such a device is suitable for forming multi-leads in that the total spacing around the semiconductor device can be utilized effectively when the semiconductor device is packaged on a packaging substrate.

A lead frame of the type used for the assembling of such a QFP type semiconductor device is disclosed in "VLSI Packaging Technique (the first volume)" issued on May 31, 1993, pp. 155 to 164, and in particular an example of the pattern is shown on p157 and p159.

Further, since the number of elements formed on a semiconductor chip has been increased by means of the above-mentioned refinement and since these elements are operated at a higher speed, the generation of heat from the semiconductor chip has also increased. A semiconductor device in which heat radiation performance has been improved for the purpose of coping with this problem using a heat spreader is described in, for example, "VLSI Packaging Technique (the last volume)" pp. 200 to 203. In this semiconductor device, the heat radiation performance of the semiconductor device is improved by installing a heat spreader on a semiconductor chip.

SUMMARY OF THE INVENTION

In order to cope with the problems of multi-lead formation, as described above, it is necessary in a lead frame to diminish the lead pitch, which is the spacing between leads, as well as the width dimension of the lead.

Further, similar to the above, a plurality of pad electrodes are provided in a semiconductor chip in recognition of the increased number of functions, as described above, and the pad pitch, which is the spacing between pad electrodes, is also made smaller. Generally, there are a variety of pitches of the pad electrodes of a semiconductor chip, but it is desirable for the chip size to be small in order to increase the number of chips acquired per wafer. Thus, there is a tendency for the pitch among respective pad electrodes also to be made smaller.

However, there is a problem in that a short-circuit in which adjacent wires come into contact with each other becomes more likely as the spacing becomes smaller when multi-leads and respective pad electrodes are bonded with each other using a wire of Au or the like. Since the wires bonded to the pad electrodes stretch in an oblique direction with respect to a semiconductor chip at a corner portion of the semiconductor chip in particular, the spacing between wires becomes small even when the pad pitches are the same, and so the tendency for a short circuit to occur is more likely.

Further, there is a problem in that wire running, in which a wire is transformed by the flow of molding resin due to the lowering of the mechanical strength of respective leads, or a decrease in the wire spacing sometimes occurs in the case of resin molding after wire bonding, and so a short-circuit of the wires is often produced under these circumstances.

In addition, in a QFP, the area in which the leads are arranged becomes narrower as one gets nearer a semiconductor chip installed at the center of the support. As a result, when the lead pitch cannot be refined sufficiently with respect to the pad pitch of a semiconductor chip due to the limit of working accuracy of the leads, it becomes impossible to bring the point of the lead close to the semiconductor chip. Therefore, the wire for bonding the pad electrode and the lead with each other cannot help but be lengthened. When the wire is lengthened in such a manner, the probability of generation of the above-mentioned short-circuit or wire running conditions becomes higher.

Further, since the mechanical strength of respective leads is lowered by such refinement of the leads, the leads and more liable to be transformed by a slight force, and so a short-circuit condition is also created by such a transformation.

It is an object of the present invention to provide a technique which is capable of preventing a short-circuit or wire running condition in a semiconductor device having multi-leads from occurring and of stabilizing the bonding.

It is another object of the present invention to provide a technique which is capable of improving the heat radiation characteristics of a semiconductor device having multi-leads.

The above-mentioned and the other objects and unique features of the present invention will become apparent from the following description of the present invention and the accompanying drawings.

Among those features that are disclosed in the present application, summaries of representative features will be described briefly as follows.

In a semiconductor device in which a semiconductor chip is mounted on a supporting body and inner leads are fixed to this supporting body through an insulator, points of the inner leads are fixed to the whole periphery of the semiconductor chip mounting area by an adhesive layer provided on the whole surface of the above-mentioned supporting body.

Furthermore, the largest lead pitch is set to less than double the smallest lead pitch with respect to the lead pitch at the points of respective inner leads.

Furthermore, the lead pitch at inner lead points corresponding to a corner portion of a semiconductor chip is made wider than the lead pitch at the other lead points.

Alternatively, a dummy lead which does not extend outside a sealing body is provided among inner leads corresponding to the corner portion of the semiconductor chip.

Furthermore, the pad pitch of pad electrodes located at the corner portion of a semiconductor chip is made wider than the pad pitch of the other pad electrodes.

According to the above-mentioned features, it becomes possible to have the points of the inner leads come closer to a semiconductor chip mounting area by fixing the inner lead points to the whole periphery of the semiconductor chip mounting area. Therefore, a short-circuit, in which adjacent wires come into contact with each other, and wire running, in which the wires are transformed by means of the flow of mold resin, are avoided.

Further, since it becomes possible to make the lead pitch at the inner lead points corresponding to the corner portion wider than the lead pitch at the other inner lead points, the possibility of a short-circuit, in which adjacent wires come into contact with each other, and wire running, in which the wire is transformed by the flow of mold resin, is decreased.

Furthermore, since turbulence is reduced in the flow of resin with the providing of a dummy lead, poor resin injection due to the presence of a void is decreased.

Furthermore, it becomes possible to perform cross-bonding easily because there is no tab suspending lead.

Furthermore, it becomes possible to perform a production process to make a lead frame with a supporting body easier and to reduce the production cost by forming an adhesive layer in advance on the whole surface of the supporting body, thereby to fix the inner leads.

Furthermore, by mounting a semiconductor chip on a supporting body, the heat generated in the semiconductor chip can be radiated outside through the supporting body, thus making it possible to improve the heat radiation characteristics of the semiconductor chip.

DESCRIPTION OF THE PREFERRED EMBODIMENTS

Figure 1:
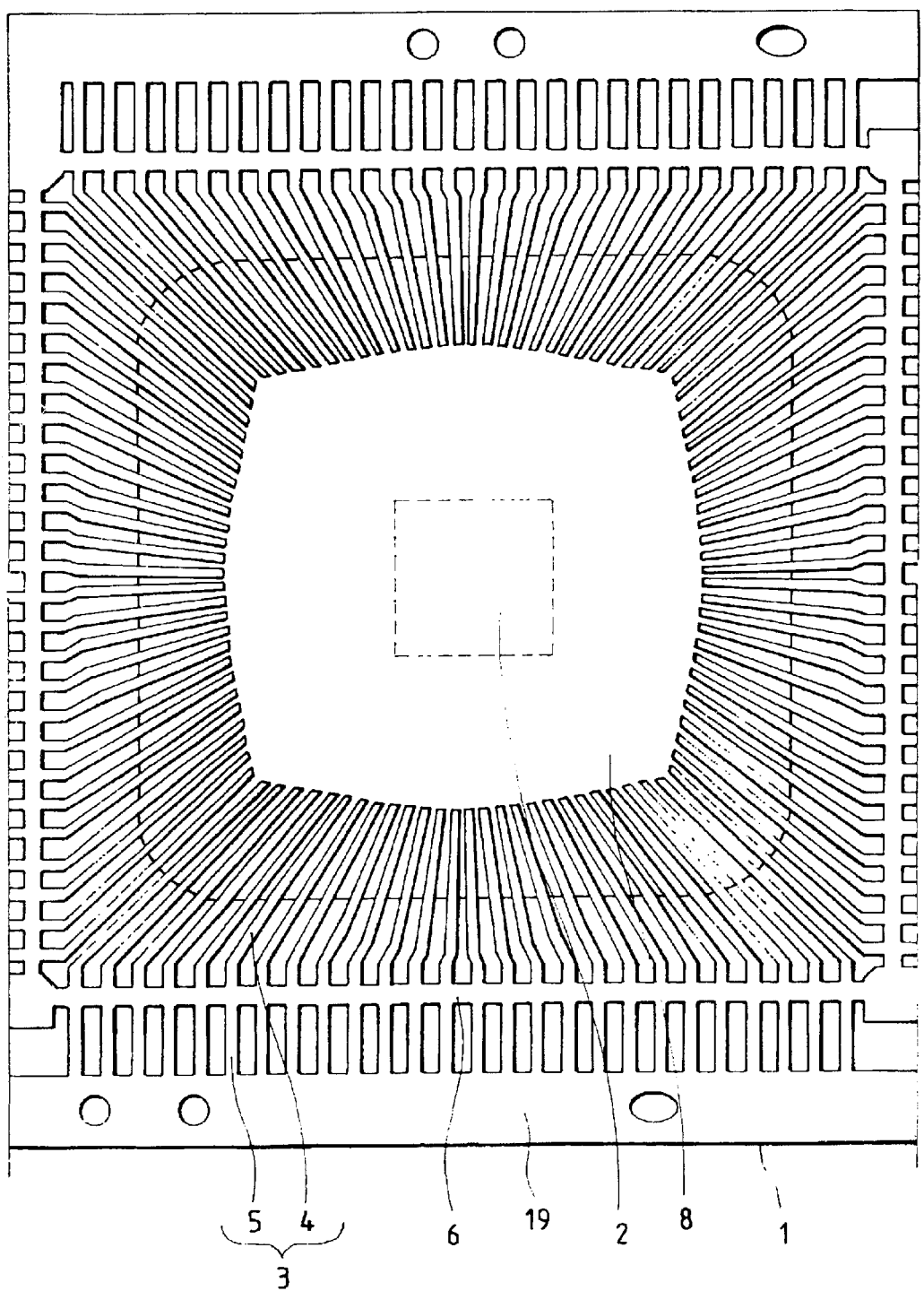
FIG. 1 is a plan view showing a lead frame which forms an embodiment of the present invention.

Embodiments of the present invention will be described hereinafter. In particular, in all of the drawings representing the various embodiments, identical reference numerals are assigned to those elements that have the same function, and repeated description thereof is omitted.

Figure 2:
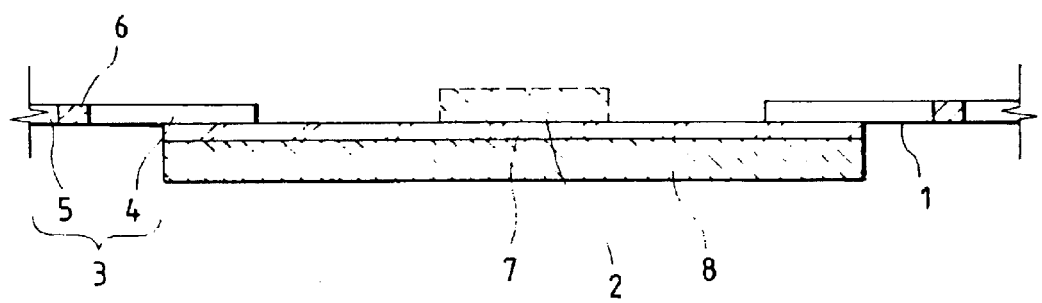
FIG. 2 is a longitudinal sectional view of the lead frame shown in FIG. 1.

FIG. 1 is a plan view showing a lead frame used in a QFP type semiconductor device forming an embodiment of the present invention, and FIG. 2 is a longitudinal sectional view of the lead frame shown in FIG. 1. The lead frame 1 is made of a Fe—Ni alloy, for instance, and the points of the inner leads 4 of a plurality of leads 3 are arranged around the entire periphery of a semiconductor chip (shown with a broken line) mounting area 2 where a semiconductor chip is to be mounted at the center of the frame. Further, the lead frame 1 may be made of a Cu alloy.

Respective leads 3 are formed as one body with a dam bar 6 or a tie bar 19 to form a frame body of a lead frame and an inside portion and an outside portion of the dam bar 6 of the respective leads 3 serve as inner leads 4 and outer leads 5, respectively.

Such a lead pattern is formed by a well-known etching technique or a press technique and so on. In a normal QFP type semiconductor device, several tens of lines to several hundred of lines of leads 3 are arranged; for example, 104 lines of leads 3 are arranged in the present embodiment. The points of the inner leads 4 of respective leads 3 are fixed to the surface of the supporting body 8 by an insulating adhesive 7 formed on the whole surface of the supporting body.

In the lead frame 1 according to the present invention, the semiconductor chip is fixed to the semiconductor chip mounting area 2 of the supporting body 8 fixed to the inner leads 4. Thus, a tab suspending lead for supporting a tab (die pad) for mounting a semiconductor chip is not provided, but the area where a tab suspending lead previously has been provided is utilized for arranging the inner leads 4. As a result, the inner leads 4 are also arranged at the corner portion where a tab suspending lead has been heretofore provided; and, with respect to lead pitches, which are spacings at the points of respective inner leads, the largest lead pitch is less than double the smallest lead pitch along the entire periphery including the corner portion, and there is no room for arranging the other leads among respective inner leads 4. In other words, the lead frame of the present embodiment is formed so that the relationship among the allowable largest lead spacing (L) at the points of adjacent inner leads and the smallest inner lead spacing (W1) and the smallest inner lead width (W2) determined in advance by the working accuracy or the design value of the lead frame satisfies the expression 1 shown below.

$$(L)<2X(W1)+(W2) \quad \text{(expression 1)}$$

Thereupon, in accordance with the present invention, it becomes possible to have the points of the inner leads 4 come closer to the semiconductor chip mounting area 2, even for the same lead pitch, by arranging the inner leads 4 at equal intervals over the entire periphery of the semiconductor chip mounting area, including the location where the tab suspending lead has been provided heretofore. Accordingly, it becomes possible to shorten the wire length when wire bonding is performed after the semiconductor chip is mounted, thus reducing the occurrence of wire running at the time of resin sealing, while also reducing short-circuits among the wires.

Here, it is possible to improve the heat radiation property of a semiconductor device by using a material having a high thermal conductivity, such as a Cu material or an Al material, for the supporting body 8. Further, since the mechanical strength of respective leads 3 is improved by fixing the inner leads 4 of a plurality of leads 3 to the supporting body 8, deformation of the inner leads 4 by a force directed from the outside becomes less likely to occur even when the lead pitch of the inner leads 4 is made small. As a result, it becomes possible to prevent a short-circuit among bonding wires from occurring.

Besides, although there has been a tabless device formed by the conventional technique using a heat spreader, the heat spreader has been heretofore recognized only as a subject of thermal radiation. According to the present invention, it is utilized positively for the solution of a lead pitch problem so as to improve the stability of the bonding.

Next, the lead frame shown in FIG. 1 and a method of manufacturing a semiconductor device using the lead frame will be described with reference to FIG. 2, FIGS. 3(a)–(c) and FIG. 4.

Figure 3A:
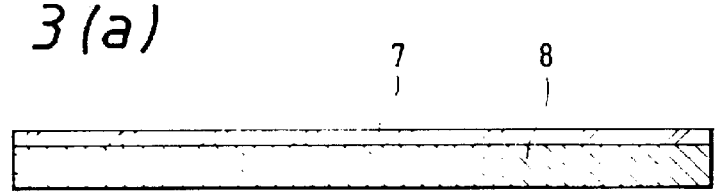
FIGS. 3(a) to 3(c) are longitudinal sectional views showing a method of manufacturing a lead frame which forms an embodiment of the present invention.

First, as shown in FIG. 3(a), an adhesive 7 is applied in advance to the whole surface of the supporting body 8 on which the inner leads 4 are to be adhered. As the adhesive, for example, a thermosetting resin, such as an epoxy resin and phenol resin, or a thermoplastic resin, such as a polyethylene and vinyl chloride resin, may be used. The supporting body 8 is obtained by blanking a metal thin plate and so on, but the adhesive 7 may be applied before such working or after the working. By applying the adhesive to the whole surface, it is possible to perform masking or the like at the time of applying the adhesive and to decrease the production cost of a lead frame having the supporting body 8. Further, the adhesive 7 may also be a polyimide resin in a film form. In this case, it is possible to perform punching after applying the polyimide resin in a film form onto a base metal plate, which becomes the supporting body 8.

Figure 3B:
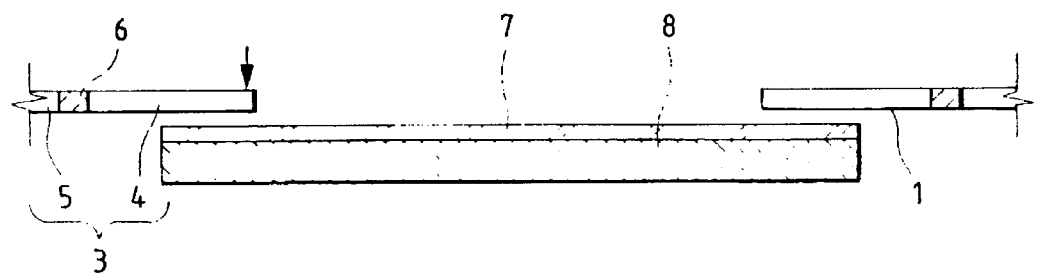

Next, as shown in FIG. 3(b), respective inner leads 4 of the lead frame 1, to which patterning is applied, are secured to the supporting body 8 with the adhesive 7. This state is shown in FIG. 2. In the case of the present example, the adhesive 7 is cured before adhesion by heat treatment at approximately 300° C.

Figure 3C:
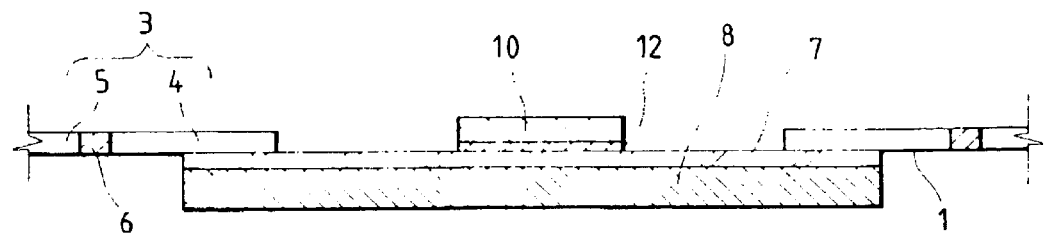

Next, as shown in FIG. 3(c), a semiconductor chip 10 is secured to the semiconductor chip mounting area 2 of the supporting body 8 using an Ag paste 12. A method of applying the adhesive 7 to the inner leads 4 and of thereafter securing the inner leads 4 to the supporting body 8 has been heretofore employed, but there has been a problem with such a conventional method in that an inferior product may be produced because the inner leads are transformed at the time of applying the adhesive thereto. In accordance with the present invention, however, it becomes possible to solve the above-mentioned problem by securing the inner leads 4 after the adhesive 7 has been applied to the supporting body 8 in advance.

Figure 4:
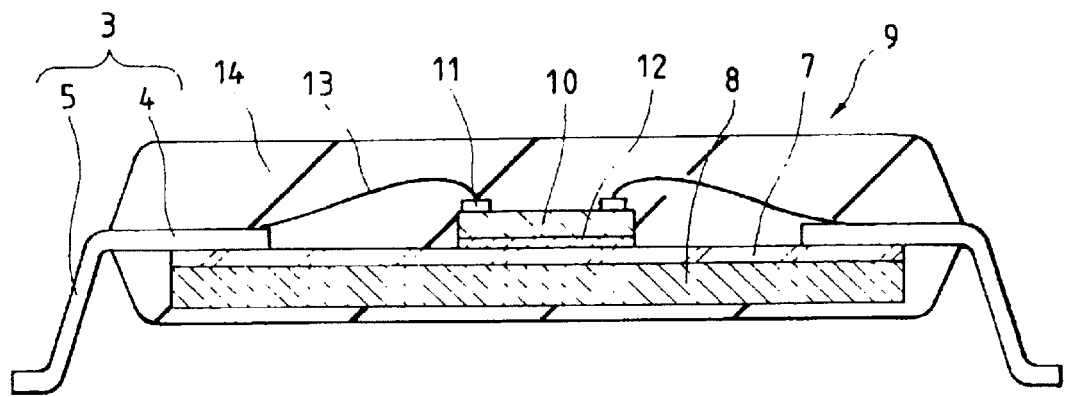
FIG. 4 is a longitudinal sectional view showing a semiconductor device of the present invention.

Thereafter, as shown in FIG. 4, a pad electrode 11 of a semiconductor chip 10 and an inner lead 4 are connected to each other by a bonding wire 13 of Au or the like. Since it is possible in accordance with the present invention to fix the inner lead 4 and perform wire bonding by applying vacuum suction to the back of the supporting body 8, because the inner lead 4 is fixed to the supporting body 8, it is not necessary to use a window clamper for fixing the inner lead with pressure, as is done in forming a conventional lead frame.

After wire bonding is completed, the semiconductor chip 10, the supporting body 8, the bonding wire 13 and the inner lead 4 are sealed by means of a sealing body 14, composed of an epoxy resin for instance, and the dam bar 6 and the tie bar 19 are cut off, thereby to separate the respective leads 3 electrically. Thereafter, the outer lead 5 extending from the sealing body 14 is formed in a gull wing shape, as seen in FIG. 4 as an example, whereby the semiconductor device 9 is completed.

Figure 5:
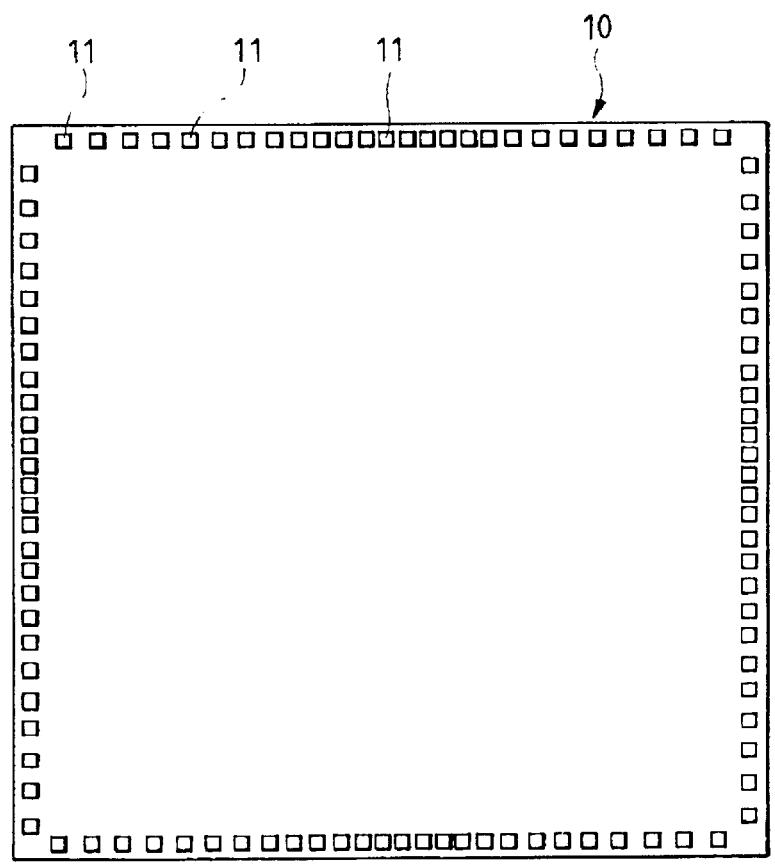
FIG. 5 is a plan view showing a semiconductor chip to be used in a semiconductor device of the present invention.
Figure 6:
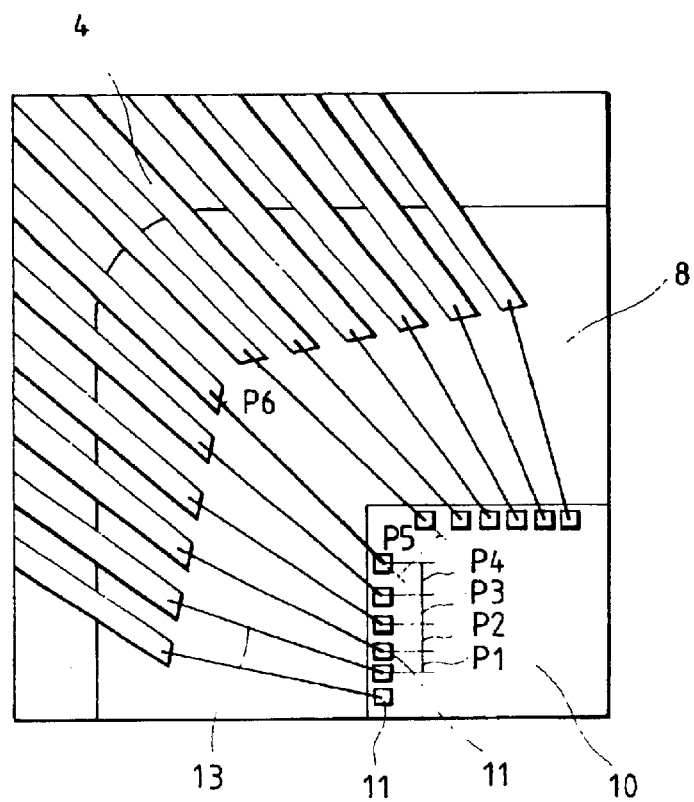
FIG. 6 is a plan view showing a corner wire bonding to the semiconductor chip of FIG. 5.

Next, the wire bonding arrangement of a semiconductor device of the present invention will be described with reference to FIG. 5 and FIG. 6. FIG. 5 is a plan view for explaining the arrangement of pad electrodes 11 of the semiconductor chip 10, and FIG. 6 is a partially enlarged plan view for explaining a bonding state at the corner portion of the semiconductor chip 10.

In a semiconductor device of the present invention, the semiconductor chip 10 is fixed to the semiconductor chip mounting area of the supporting body 8 to which the inner leads 4 are also fixed. Therefore, a tab suspending lead for supporting a tab (die pad) for mounting the semiconductor chip 10 is not provided, but the area where a tab suspending lead has been provided heretofore is utilized for arranging the inner leads 4.

As a result, the inner leads 4 are also arranged at the corner portion where a tab suspending lead has been heretofore provided, and, with respect to the lead pitch, which determines the intervals at the points of respective inner leads along the whole periphery including the corner portion, the inner leads are arranged at almost equal spacings over the whole periphery, and it becomes possible to have the points of the inner leads 4 come closer to the semiconductor chip 10 even in the case of the same lead pitch. For example, the lead pitch P at the points of respective inner leads 4 may be set at approximately 180 μm to 220 μm.

A plurality of pad electrodes 11, which serve as external terminals of the semiconductor chip 10, are provided along the marginal portion of the semiconductor chip 10, but the pad pitch is made wider as one gets near the corner of the semiconductor chip in accordance with the present invention.

In an example shown in FIG. 6, when it is assumed that the pad pitch to the center of the inner peripheral portion of the pad electrode 11 of the semiconductor chip 10 is P1, the pad pitch thereafter is made wider by 0.1P1 each interval as one gets near the corner in such a manner that P2=1.1P1, P3=1.2P1 and P4=1.3P1. For example, in the semiconductor chip 10 used in a semiconductor device of high integration degree, the pitch of the pad electrodes 11 is set to approximately 80 μm to 100 μm.

The bonding for connecting the pad electrodes 11 to the points of the inner leads 4 is effected by the wires 13, but the pad pitch is made wider in the arrangement in the pad electrodes 11 as one gets near the corner. Accordingly, it is possible to prevent the wires 13 at the corner portion from coming into contact with adjacent wires 13 to thereby produce a short-circuit even when the wire 13 is transformed by the occurrence of wire running or the like. As an example, an Au fine wire or the like having a diameter of approximately 25 µm to 35 µm is used as the bonding wire 13.

Further, in the semiconductor chip 10, the pad pitch P5 between the pad electrode 11 at the outer end of the peripheral portion and the pad electrode 11 at another outer end of the peripheral portion, which is adjacent to the pad electrode 11 with the corner of the semiconductor chip 10 being disposed therebetween, is made wider than the other pad pitch and is made wider than the lead pitch P6 at this portion from a point of pulling around the wires 13.

Further, since the inner leads 4 are fixed to the supporting body 8 in the case of the wire bonding in accordance with the present invention, it is possible to perform wire bonding with the inner leads 4 fixed by application of vacuum suction to the back of the supporting body 8. Accordingly, it is not necessary to use a wind damper which fixes the inner leads with pressure, as in the formation of a conventional lead frame.

After the wire bonding is completed, the semiconductor chip 10, the supporting body 8, the bonding wire 13 and the inner lead 4 are sealed by a sealing body 14 composed of an epoxy resin for instance, the dam bar 6 and the tie bar 19 are cut off and respective leads 3 are separated electrically, so that the outer lead 5 extending from the sealing body 14 may be formed into a gull wing shape, as seen in FIG. 4 as an example, thus completing a semiconductor device 9.

In such a semiconductor device, it is possible to decrease production of an inferior product due to the occurrence of wire running by approximately half as compared with the past. Besides, as to how to expand the above-mentioned pad pitch, the present invention can be implemented using a method of expanding the corner portion partially in addition to a method of expanding the pad pitch uniformly from the above-mentioned center of the peripheral portion.

Next, a semiconductor device which represents a variation of the present invention will be described with reference to FIG. 7 and FIG. 16.

Figure 7:
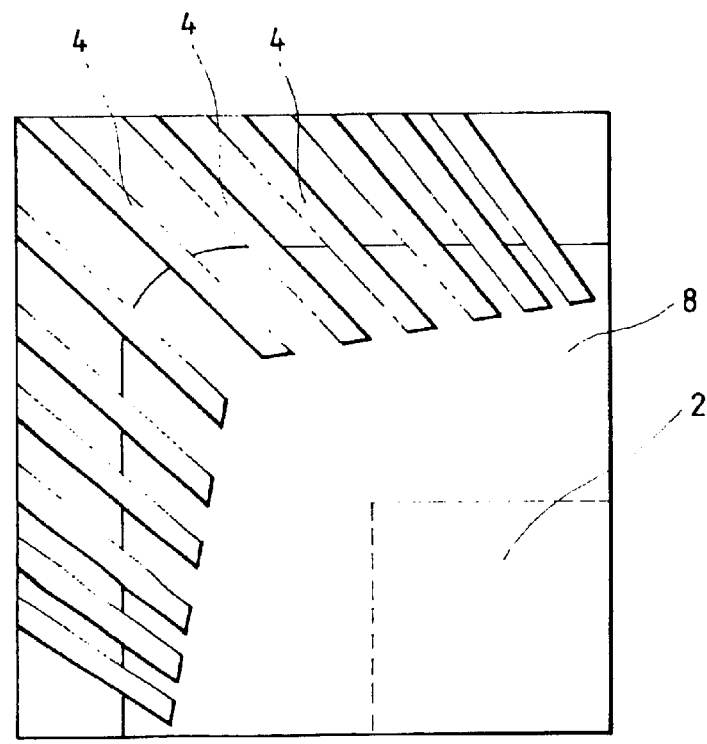
FIG. 7 is a plan view showing a portion of a lead frame of the type used in a QFP type semiconductor device according to the present invention.
Figure 16:
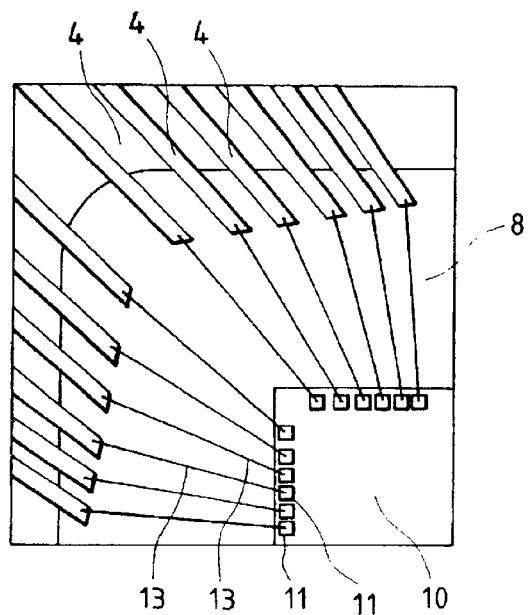
FIG. 16 is a plan view showing a portion of a semiconductor device according to the present invention.

FIG. 7 is a plan view partially showing a lead frame used in a QFP type semiconductor device of the present invention, and FIG. 16 is a plan view showing a semiconductor device partially.

The lead frame 1 is composed of, for example, a Fe—Ni alloy or a Cu alloy, and the points of the inner leads 4 of a plurality of leads 3 are arranged over the whole periphery of a semiconductor chip (shown with a broken line) mounting area 2 at the center of the frame.

The inner leads 4 of respective leads 3 and the semiconductor chip 10 are fixed to the surface of a supporting body 8 with insulating adhesives. As the adhesives, for example, a thermosetting resin, such as an epoxy resin and phenol resin, or a thermoplastic resin, such as a polyethylene and a vinyl chloride resin, may be used.

In a semiconductor device of the present invention, the semiconductor chip 10 is fixed to the semiconductor chip mounting area of the supporting body 8 to which the inner leads 4 are also fixed. As a result, no tab suspending lead for supporting a tab (a die pad) mounting the semiconductor chip 10 is provided, but it is possible to utilize the area where the tab suspending lead has been provided heretofore for the arrangement of the inner leads 4.

Thus, in accordance with the present invention, it becomes possible to arrange the points of the inner leads 4 along the whole periphery of the semiconductor chip mounting area 2, and to make the lead pitch at the points of the inner leads 4 corresponding to the corner portion of the semiconductor chip mounting area 2 wider than the lead pitch at the other inner leads 4. Thus, when wire bonding is performed after mounting the semiconductor chip, the spacing between mutual wires 13 becomes wider, and the possibility of occurrence of a short-circuit among the wires 13 is decreased.

Here, it is possible to improve the heat radiation performance of a semiconductor device by using a material having high thermal conductivity, such as a Cu material and an Al material.

Further, since the mechanical strength of respective leads 3 is improved by fixing the inner leads 4 of a plurality of leads 3 to the supporting body 8, transformation by a force applied from the outside is less likely to be produced even when the lead pitch of the inner leads 4 is made small. Thus, it becomes possible to prevent a short-circuit among bonding wires 13 from occurring.

Further, a plurality of pad electrodes 11 are provided along the marginal portion of the semiconductor chip 10, but, in accordance with the present invention, the pad pitch is provided wider as one comes near the corner of the semiconductor chip. For example, in a semiconductor chip 10 used in a semiconductor device of high integration degree, the pitch of the pad electrodes 11 is set at approximately 80 µm to 100 µm.

Bonding for connecting the pad electrodes 11 and the points of the inner leads 4 with each other is effected by the wires 13, but it is possible to prevent the wires 13 at the corner portion from coming into contact with the adjacent wires 13 and being short-circuited even when the wires 13 are transformed by the occurrence of wire running or the like, since the pad pitch is provided wider in the pad electrodes 11 as one gets near the corner. As an example, an Au fine wire or the like having a diameter of approximately 25 µm to 35 µm is used as the bonding wire 13.

Further, in the semiconductor chip 10, the pad pitch between the pad electrodes 11 at the outer end of the marginal portion and adjacent pad electrodes 11 at another outer end of the marginal portion is made wider than another pad pitch in order to provide universality to some extent, and becomes wider than the lead pitch sometimes. In such a case, it is also possible to obtain enlargement of the pad pitch by bringing the above-mentioned pad electrode 11 at the outer end closer to the corner.

Further, in the case of wire bonding, it is possible in accordance with the present invention to perform wire bonding with the inner leads 4 fixed by application of vacuum suction to the back of the supporting body 8 since the inner leads 4 are fixed to the supporting body 8, and so it is not necessary to use a wind damper for fixing the inner leads with pressure, as in the production of a conventional lead frame.

After wire bonding is completed, the semiconductor chip 10, the supporting body 8, the bonding wire 13 and the inner lead 4 are sealed with a sealing body 14 composed of an epoxy resin for instance, the dam bar 6 and the above-mentioned tie bar 19 are cut off and respective leads 3 are separated electrically, and an outer lead 5 extending from the sealing body 14 is formed, thus completing a semiconductor device 9.

In such a semiconductor device of the present invention, it is possible to reduce the production of inferior products due to the occurrence of wire running by approximately half as compared with the past.

Besides, as a method of expanding the above-mentioned pad pitch, it is possible to implement the present invention using a method of expanding the corner portion partially or the like, in addition to the above-mentioned method of expanding the pad pitch uniformly from the center of the marginal portion.

Figure 17:
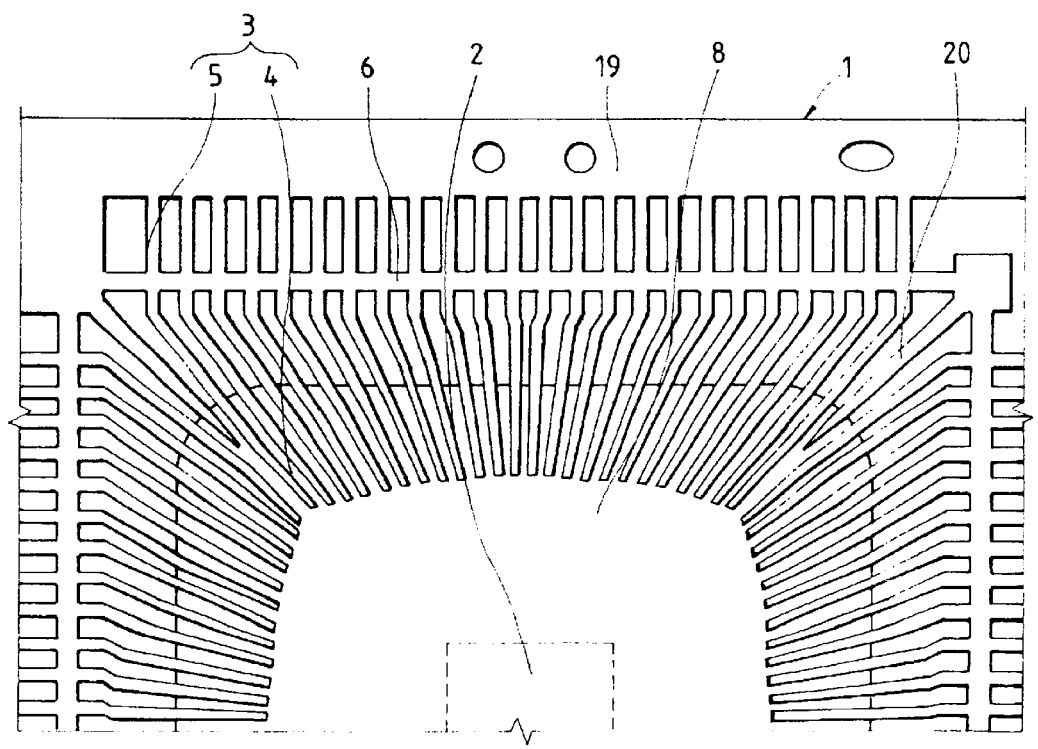
FIG. 17 is a plan view showing a portion of a semiconductor device of the present invention.

Next, a lead frame which represents another embodiment of the present invention will be described with reference to FIG. 17. FIG. 17 is a partially enlarged plan view of the lead frame.

In the lead frame 1 of the present embodiment, a semiconductor chip (shown with a broken line) is fixed to a semiconductor chip mounting area 2 of a supporting body 8 fixed to the inner leads 4. As a result, no tab suspending lead for supporting a tab (a die pad) mounting a semiconductor chip 10 is provided, but the area where a tab suspending lead has been provided heretofore is utilized for arrangement of the inner leads 4.

As to the arrangement of an outer lead 5 at the corner portion when such an arrangement of the inner leads 4 is made, the outer lead 5 is spaced a little from the corner of the sealing body 14 for the purpose of protection of the outer lead 5 or security of a resin injection channel. Therefore, it happens sometimes that a spacing where the inner leads 4 are not arranged is produced at the corner portion of the sealing body 14.

When such a spacing is provided, turbulence is produced in the flow of resin injected into this portion at the time of resin injection. Thus, a void is generated, which causes poor resin injection sometimes.

In order to solve such a problem, according to the present invention, a dummy inner lead 20 which does not extend outside the sealing body after the lead frame is cut off is provided at the corner portion where a tab suspending lead has been heretofore provided. The dummy lead 20 has a wider width than the other inner leads 4 and the point thereof is spaced outward of the points of the inner leads 4 relative to the semiconductor chip, and the points of the inner leads 4 are arranged over the whole periphery of the semiconductor chip mounting area 2.

In accordance with the present invention, a disturbance is prevented from being produced in the flow of resin by this dummy lead 20. Accordingly, it is possible to reduce the production of poor resin injection products due to occurrence of a void in the semiconductor device by use of the present invention. Further, it becomes possible to support the supporting plate 8 more firmly by fixing the four corners of the supporting plate 8 with the dummy leads 20.

Furthermore, in the conveyance of the lead frame among processes in the production of a lead frame, it is possible to perform such conveyance by holding a sealing body deriving portion of the dummy lead 20 before cutting off the lead frame, and in this way it is possible to prevent deformation of the outer lead 5 which could be produced by holding and conveying the frame by the outer lead 5.

Figure 18:
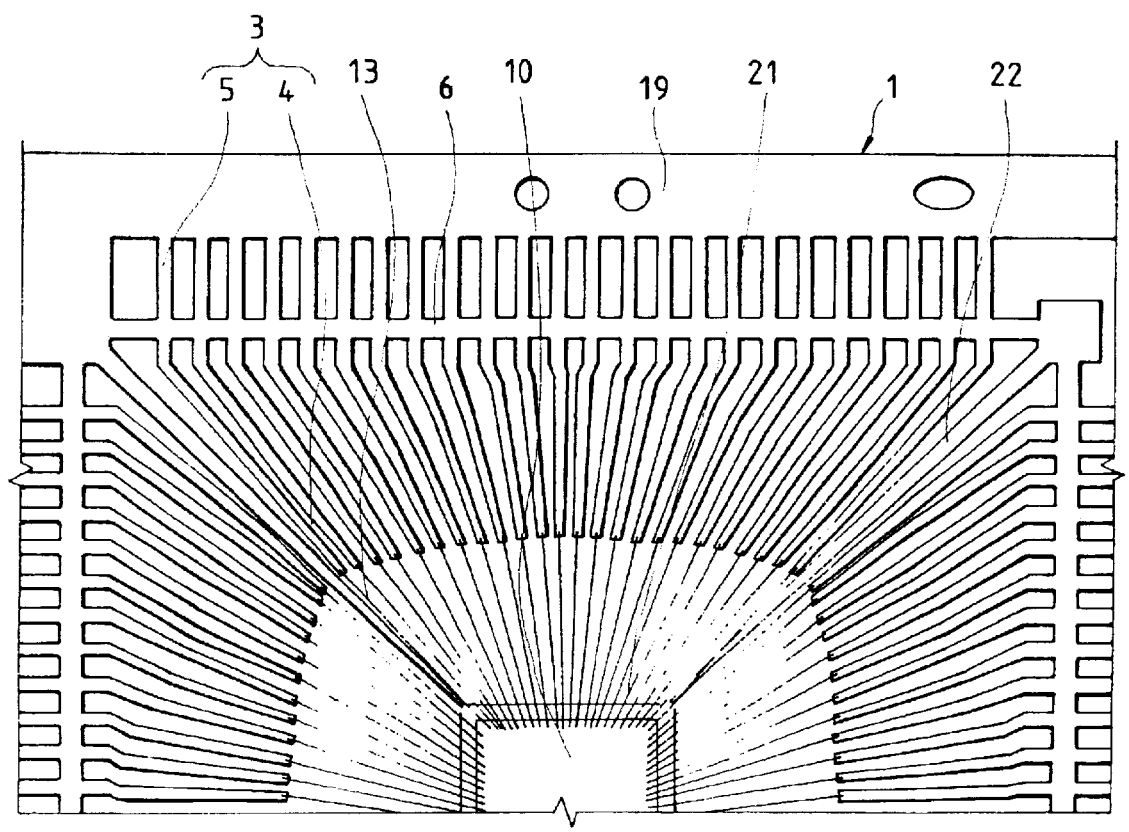
FIG. 18 is a plan view showing a portion of a semiconductor device which has been examined by the present inventor at stages leading to the present invention.
Figure 19:
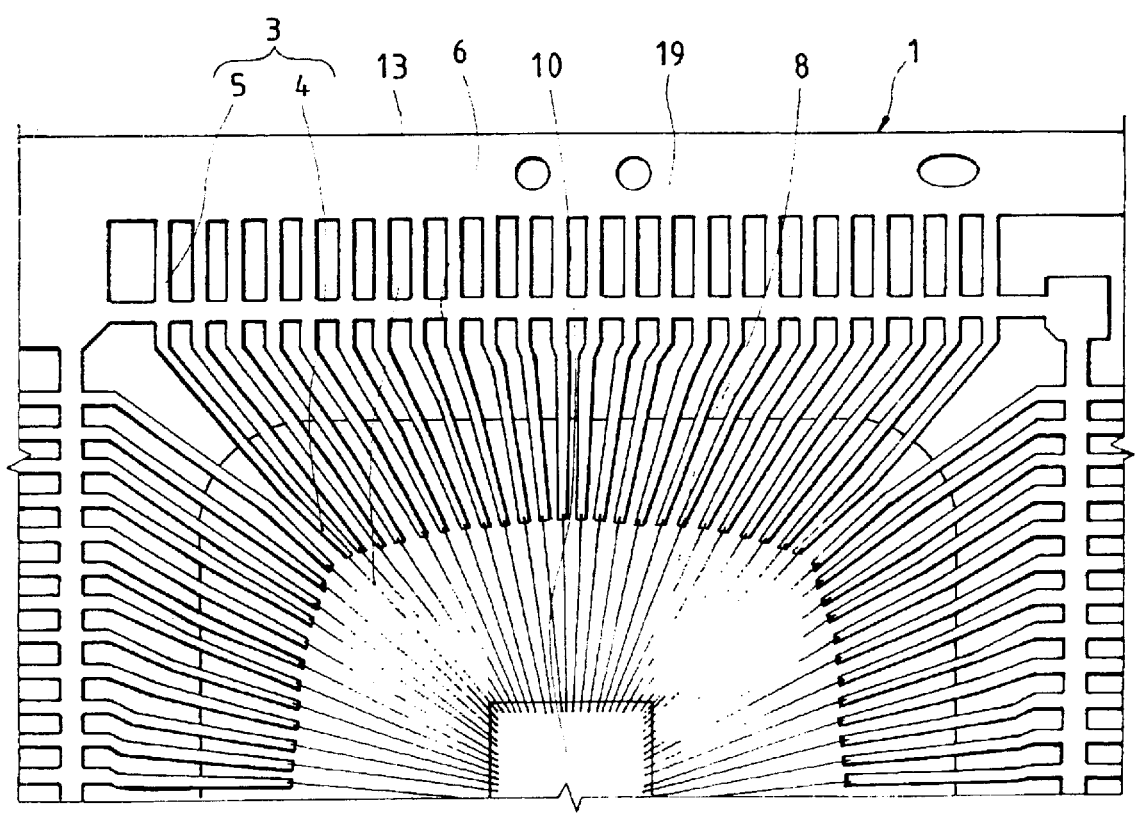
FIG. 19 is a plan view showing a portion of a semiconductor device representing the present invention.

Next, a semiconductor device which embodies another feature of the present invention will be described with reference to FIG. 18 and FIG. 19. FIG. 18 is a partially enlarged plan view for describing a semiconductor device which has been examined by the present inventor at stages leading to the present invention, and FIG. 19 is a partially enlarged plan view of a semiconductor device of the present invention.

In the semiconductor device shown in FIG. 18, the inner leads and pad electrodes provided on the side of the semiconductor chip opposing to these inner leads are connected with each other.

In the case where it is necessary to seal the same semiconductor chips in sealing bodies of different types, however, cross bonding in which the points of the inner leads corresponding to the corner portion of the semiconductor chip are connected to the pad electrodes of the semiconductor chip provided along the other side adjacent to a side of a semiconductor chip opposing those inner leads is required sometimes.

In such a case, in a conventional semiconductor device in which a semiconductor chip 10 is fixed to a tab 21 and this tab 21 is supported by a tab suspending lead 22, as shown in FIG. 18, a bonding wire 13 crosses the top of the tab suspending lead 22. Thus, in order to prevent generation of a defect caused by contact between the bonding wire 13 and the tab suspending lead 22, various restrictions are provided in such bonding, thus making the bonding difficult.

In a semiconductor device of the present invention, the semiconductor chip 10 is fixed to a supporting body 8 to which the inner leads 4 are also fixed. Thus, the tab 21 (die pad) for mounting the semiconductor chip 10 and the tab suspending lead 22 for supporting this tab are not provided, but the area where the tab suspending lead 22 has been provided heretofore is utilized for the arrangement of the inner leads 4.

By adopting such an arrangement of the inner leads 4, the generation of a defect caused by contact between the bonding wire 13 and the tab suspending lead 22 is eliminated even when the above-described cross bonding is performed, thus improving the reliability of the products. Further, it becomes possible to perform the above-described cross bonding easily, thus improving the degree of freedom of bonding.

Figure 8:
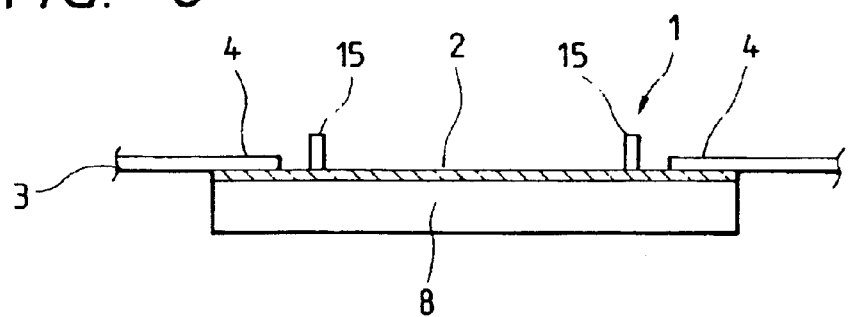
FIG. 8 is a sectional view showing a lead frame of the present invention.
Figure 9:
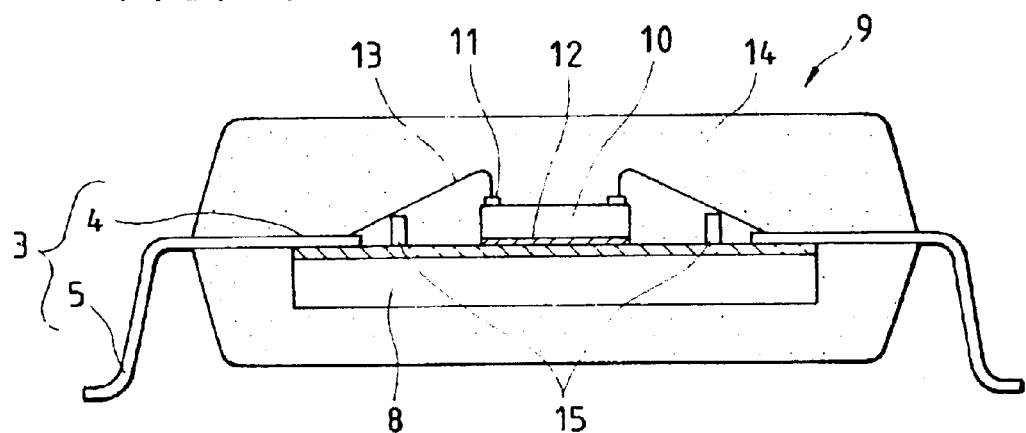
FIG. 9 is a longitudinal sectional view showing a semiconductor device manufactured using the lead frame shown in FIG. 8.

FIG. 8 is a sectional view showing another feature of a lead frame according to the present invention, and FIG. 9 is a longitudinal sectional view showing a semiconductor device manufactured using this lead frame.

The lead frame 1 according to the present invention is featured by the fact that a wire supporting portion 15 is provided between the semiconductor chip mounting area 2 of the supporting body 8 and the points of the inner leads 4.

This wire supporting portion 15 is arranged around the mounting area 2 of the supporting body 8, and is capable of supporting and maintaining a loop of the wire bonded between the pad electrodes of the semiconductor chip and respective leads at a fixed height when the semiconductor device is assembled. The wire supporting portion 15 is formed by fixing an insulating material, such as a polyimide resin and epoxy resin, by adhesives or the like, or by working the supporting body 8 partially so as to apply an insulating process to at least the portion where the wire comes in contact.

According to such a lead frame 1 of the present invention, it is possible to maintain the loop height of the wire constant because a wire supporting portion 15 for supporting the bonding wire is provided. Thus, the possible occurrence of a short-circuit among mutual wires can be reduced.

Figure 10:
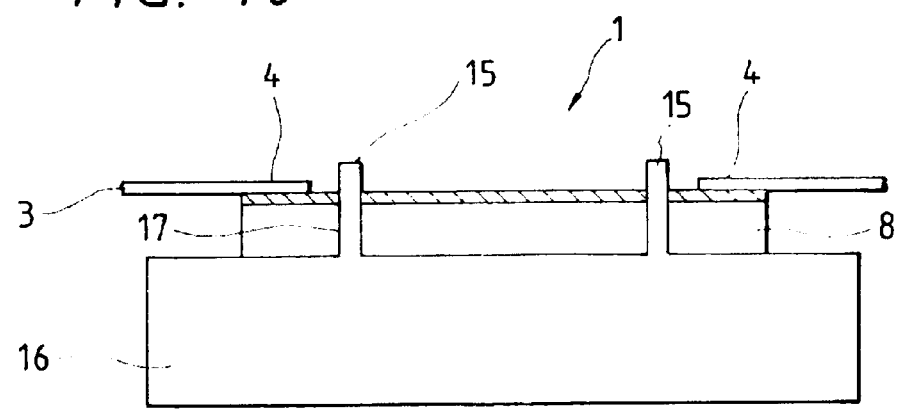
FIG. 10 is a sectional view showing a lead frame of the present invention.
Figure 11:
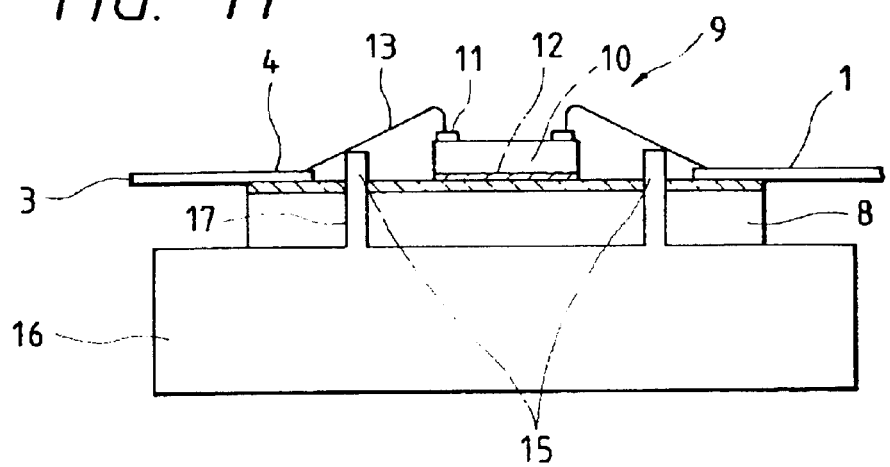
FIG. 11 is a longitudinal sectional view showing a semiconductor device manufactured using the lead frame shown in FIG. 10.

FIG. 10 is a sectional view showing a variation of a lead frame of FIG. 8 according to the present invention, and FIG. 11 is a longitudinal sectional view showing a semiconductor device manufactured using this lead frame.

The lead frame 1 according to the present invention is featured by provision of slits 17 in the supporting body 8 for projecting wire supporting portions 15, carried by a jig 16 for holding a supporting body 8, between a semiconductor chip mounting area 2 of the supporting body 8 and the points of the inner leads 4, in addition to the structure of the lead frame according to the invention described already.

When the lead frame 1 is supported by the jig 16, the wire supporting portion 15 carried by the jig 16 projects through the slits 17. Since the wire supporting portions 15 retract from the slits 17 after wire bonding is completed, it does not matter whether the wire supporting portion has an insulation property or not.

According to the present embodiment, an effect is achieved that bonding is stabilized by inserting the wire supporting portions 15 carried by the jig 16 into the slits 17 of the lead frame 1.

Figure 12:
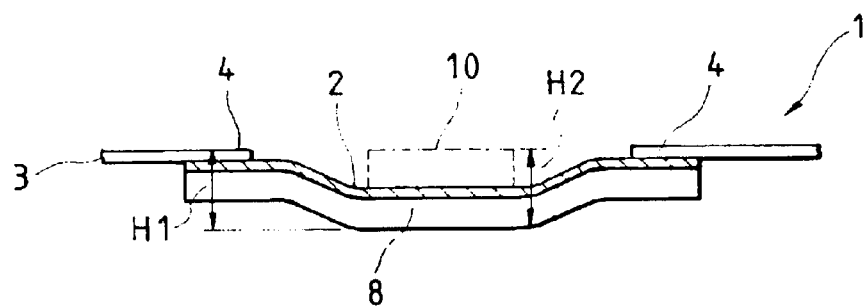
FIG. 12 is a sectional view showing a lead frame of the present invention.
Figure 13:
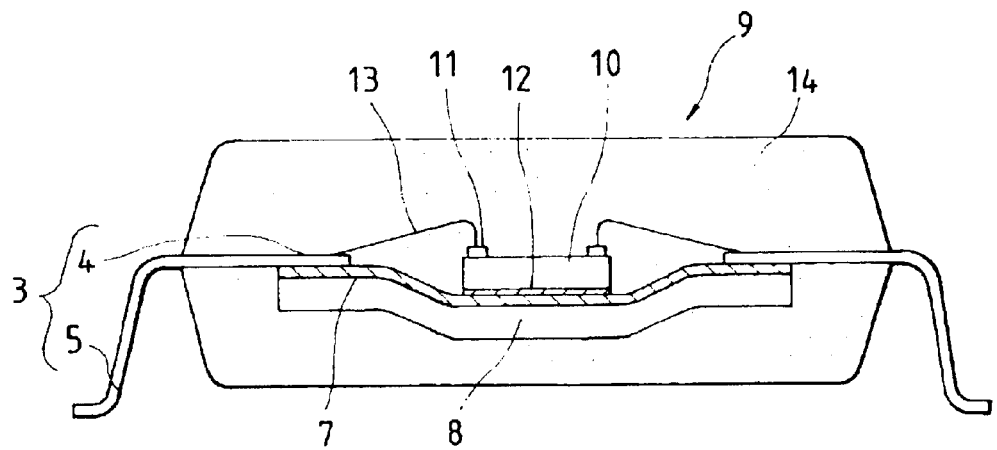
FIG. 13 is a longitudinal sectional view showing a semiconductor device manufactured using the lead frame shown in FIG. 12.

FIG. 12 is a sectional view showing another embodiment of a lead frame according to the present invention, and FIG. 13 is a longitudinal sectional view showing a semiconductor device manufactured using this lead frame.

A lead frame 1 according to the present embodiment is featured by the fact that, in addition to the structure of the lead frames described already, the semiconductor chip mounting area 2 of the supporting body 8 is offset so that pad electrodes 11 of a mounted semiconductor chip 10 and the surface of the inner leads 4 are disposed at almost the same height. Such an offset configuration can be achieved easily by utilizing a well-known press technique or the like.

By making the height H1 of the surface of the inner leads 4 and the height H2 of the surface of the mounted semiconductor chip 10 almost equal to each other as described above, it is possible, in the case of wire bonding between the pad electrodes 11 of the semiconductor chip 10 and respective inner leads 4, to increase the stability of a loop of wires 13 that are bonded. Since the loop configuration becomes fixed by increasing the stability of the loop of wires 13, it becomes possible to reduce the occurrence of wire running at the time of resin molding.

Figure 14:
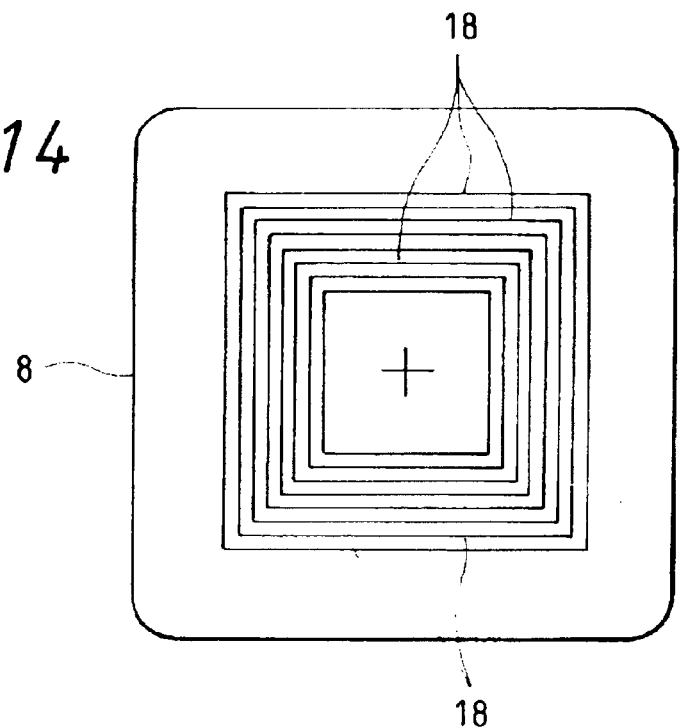
FIG. 14 is a plan view showing a supporting body used for a lead frame of the present invention.
Figure 15:
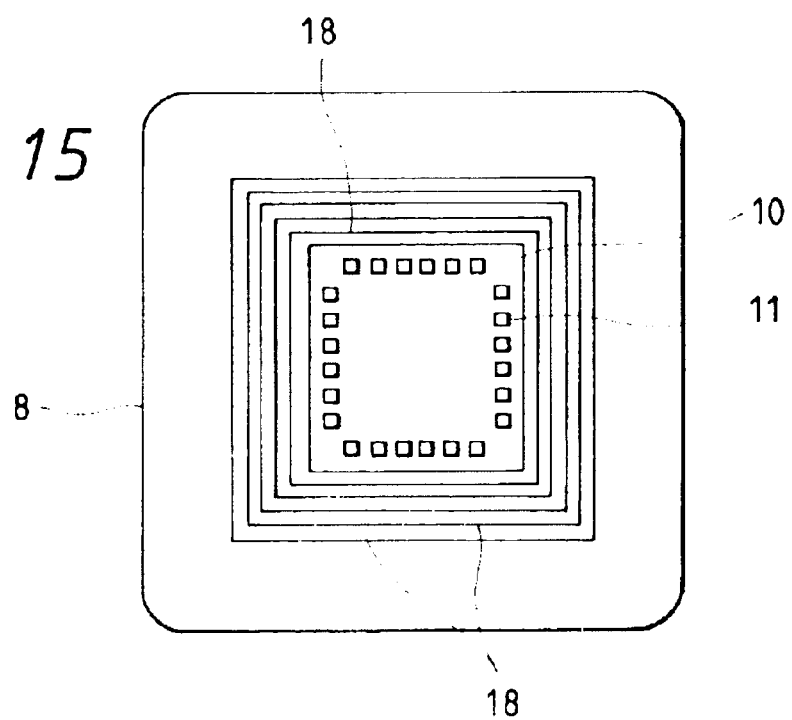
FIG. 15 is a plan view showing a state in which a semiconductor chip 10 is mounted on the supporting body shown in FIG. 14.

FIG. 14 is a plan view showing a supporting body 8 used in a lead frame which embodies another feature of the present invention, and FIG. 15 is a plan view showing a state where a semiconductor chip 10 is mounted on this supporting body 8.

A lead frame 1 according to FIG. 14 is featured by the fact that, in addition to the various structures of the lead frame 1 described already, a plurality of markers 18 corresponding to various dimensions of a mounted semiconductor chip 10 are provided on the surface of the supporting body 8. Such markers 18 can be provided easily by the techniques of printing, pressing and so on.

Since it becomes easier to confirm an accurate position for mounting a semiconductor chip when the semiconductor chip is mounted by providing markers 18 corresponding to the size of the semiconductor chip to be mounted, the efficiency of chip bonding of a semiconductor chip is improved.

Furthermore, since the positioning accuracy of the semiconductor chip is improved, it becomes possible to maintain the length of the wire constant, thus making it possible to maintain the loop of the bonding wire stably. Since the loop configuration becomes fixed by increasing the stability of the loop of the wire, it becomes possible to reduce the occurrence of wire running at the time of resin molding.

The invention made by the present inventor has been described on the basis and with reference to the above-mentioned embodiments and features, but it is a matter of course that the present invention is not limited to the above-mentioned examples, but can be modified in various ways within a scope which does not depart from the gist of the invention.

For example, a square supporting body has been illustrated in the above-mentioned examples as one to which respective leads are fixed, but a circular body can also be used as the supporting body. Since the flow of resin becomes smooth at the time of resin molding when such a circular supporting body is used, the generation of voids can be reduced by such a feature.

Further, by providing a bonding area directed toward earth bonding on the supporting body used in the above-mentioned examples, it becomes possible to apply the invention to even wider uses as a lead frame capable of coping with earth bonding.

Furthermore, the semiconductor chip to be mounted on the supporting body is not limited to a one piece chip, but a plurality of semiconductor chips can be mounted, and it also becomes possible as a result to apply the present invention to a semiconductor device formed of multi-chips.

A case where the invention principally made by the present inventor is applied to a semiconductor device, which is the field of the invention and which has become the background thereof, has been described. However, the present invention is not limited thereto, but can be applied generally to devices that are packaged with electronic components using a lead frame.

The obtainable effects which are typical among the features disclosed in the present application are described briefly as follows.

(1) According to the present invention, it is possible to make the points of the inner leads come closer to the semiconductor chip mounting area by arranging the points of the inner leads at equal intervals extending over the whole periphery of the semiconductor chip mounting area.

(2) According to the present invention, the length of the bonding wire can be shortened owing to the effects described in the above feature (1).

(3) According to the present invention, the points of the inner leads are arranged along the whole periphery of the semiconductor chip mounting area, and so the lead pitch of the points of the inner leads corresponding to the corner portion of the semiconductor chip mounting area can be made wider than the lead pitch of the points of the other inner leads.

(4) According to the present invention, the mutual spacing among bonding wires is widened at the corner portion by means of the effect described in the above feature (3).

(5) According to the present invention, short-circuits in which adjacent wires come into mutual contact or wire running in which a wire is transformed by the flow of mold resin is decreased by means of the effect described in the above features (2) and (4).

(6) According to the present invention, by mounting a semiconductor chip on the supporting body, the heat generated in the semiconductor chip can be radiated outside through the supporting body, thus making it possible to improve the heat radiation characteristics of a semiconductor chip.

(7) According to the present invention, it becomes possible to prevent generation of voids caused by disturbance of the flow of the injected resin by providing a dummy lead.

(8) According to the present invention, it becomes possible to perform cross bonding easily by eliminating the tab suspending lead.

What is claimed is:

1. A semiconductor device comprising:
   a substrate;
   a semiconductor chip mounted on one surface of said substrate, said semiconductor chip having an integrated circuit and bonding pads formed on a main surface thereof, said main surface of said semiconductor chip having a quadrilateral shape, said bonding pads being disposed along four sides of said main surface of said semiconductor chip;

a plurality of conductors being disposed on said one surface of said substrate to surround said semiconductor chip along the four sides thereof, said plurality of conductors being arranged so as to extend with one respective end thereof in a radial pattern toward said semiconductor chip such that an extension of the one respective end of at least one of said plurality of conductors extends diagonally through a corner of said semiconductor chip;

a plurality of bonding wires electrically connecting said bonding pads with tips of said plurality of conductors, respectively; and a resin body sealing said semiconductor chip, said plurality of conductors and said plurality of bonding wires;

wherein a pitch between adjacent bonding pads increases in a direction toward four corners defined by the four sides of said main surface of said semiconductor chip;

wherein a largest pitch of the tips of the conductors of two adjacent conductors at the vicinity of each of the four corners of said semiconductor chip is less than twice a smallest pitch with respect to pitches of respective tips of said plurality of conductors surrounding said semiconductor chip; and wherein the tips of the conductors terminate at a position on said one surface of said substrate so as to surround a periphery of said semiconductor chip with the bonding wires connecting the tips of the conductors with the bonding pads of said semiconductor chip.

2. A semiconductor device according to claim 1, wherein a relationship (L)<2 (W1)+(W2) exists, where (L) is an allowable largest spacing at points of adjacent conductors, (W1) is a smallest pitch of the adjacent conductors and (W2) is a smallest width of the conductors.

3. A semiconductor device according to claims 2, wherein said semiconductor chip is bonded to said substrate by a thermosetting resin.

4. A semiconductor device according to claim 2, wherein said substrate includes an insulating layer formed on said one surface thereof.

5. A semiconductor device according to claim 2, wherein said conductors are formed of a material whose principal component is copper.

6. A semiconductor device comprising:

a substrate;

a semiconductor chip mounted on one surface of said substrate, said semiconductor chip having an integrated circuit and bonding pads formed on a main surface thereof, said main surface of said semiconductor chip having a quadrilateral shape, said bonding pads being disposed along four sides of said main surface of said semiconductor chip;

a plurality of conductors being disposed on said one surface of said substrate to surround said semiconductor chip along the four sides thereof, said conductors being arranged so as to extend with one respective end thereof in a radial pattern toward said semiconductor chip such that an extension of the one respective end of at least one of said plurality of conductors extends diagonally through a corner of said semiconductor chip;

a plurality of bonding wires electrically connecting said bonding pads with tips of said conductors respectively; and a resin body sealing said semiconductor chip and said plurality of bonding wires;

wherein a pitch between first ones of adjacent bonding pads at each of four corners defined by the four sides of said main surface of said semiconductor chip is wider than a pitch between second ones of adjacent bonding pads which are disposed at other than the four corners and at a relatively central position of each of the four sides;

wherein a largest pitch of the tips of the conductors of two adjacent conductors at the vicinity of each of the four corners of said semiconductor chip is less than twice a smallest pitch with respect to pitches of respective tips of said plurality of conductors surrounding said semiconductor chip; and wherein the tips of the conductors terminate at a position on said one surface of said substrate so as to surround a periphery of said semiconductor chip with the bonding wires connecting the tips of the conductors with the bonding pads of said semiconductor chip.

7. A semiconductor device according to claim 6, wherein said semiconductor chip is bonded to said substrate by a thermosetting resin.

8. A semiconductor device according to claim 6, wherein said substrate includes an insulating layer formed on said one surface thereof.

9. A semiconductor device according to claim 8, wherein said conductors are formed on said insulating layer of said substrate.

10. A semiconductor device according to claim 6, wherein said conductors re formed of a material having copper as a principal component thereof.

11. A semiconductor device comprising;

a substrate;

a semiconductor chip mounted on one surface of said substrate, said semiconductor chip having an integrated circuit and bonding pads formed on a main surface thereof, said main surface of said semiconductor chip having a quadrilateral shape, said bonding pads being disposed along four sides of said main surface of said semiconductor chip;

a plurality of conductors being disposed on said one surface of said substrate to surround said semiconductor chip along the four sides thereof, said conductors being arranged so as to extend with one respective end thereof in a radial pattern toward said semiconductor chip such that an extension of the one respective end of at least one of said plurality of conductors extends diagonally through a corner of said semiconductor chip;

a plurality of bonding wires electrically connecting said bonding pads with tips of said conductors respectively; and a resin body sealing said semiconductor chip and said plurality of bonding wires;

wherein said bonding pads include first adjacent bonding pads disposed at each of four corners defined by the four sides of said main surface of said semiconductor chip and second adjacent bonding pads disposed at areas of the four sides of said semiconductor chip which are farther from the four corners than said first adjacent bonding pads;

wherein a pitch between said first adjacent bonding pads is wider than a pitch between said second adjacent bonding pads;

wherein a largest pitch of the tips of the conductors of two adjacent conductors at the vicinity of each of the four corners of said semiconductor chip is less than twice a smallest pitch with respect to pitches of respective tips of said plurality of conductors surrounding said semiconductor chip; and wherein the tips of the conductors terminate at a position on said one surface of said substrate so as to surround a periphery of said semiconductor chip with the bonding wires connecting the ties of the conductors with the bonding pads of said semiconductor chip.

12. A semiconductor device according to claim 11, wherein said semiconductor chip is bonded to said substrate by a thermosetting resin.

13. A semiconductor device according to claim 11, wherein said substrate includes an insulating layer formed on said one surface thereof.

14. A semiconductor device according to claim 13, wherein said conductors are formed on said insulating layer of said substrate.

15. A semiconductor device according to claim 11, wherein said conductors are formed of a material having copper as a principal component thereof.

16. A semiconductor device according to claim 1, wherein said plurality of conductors linearly extend in the radial pattern towards said semiconductor chip.

17. A semiconductor device according to claim 6, wherein said plurality of conductors linearly extend in the radial pattern towards said semiconductor chip.

18. A semiconductor device according to claim 11, wherein said plurality of conductors linearly extend in the radial pattern towards said semiconductor chip.

* * * * *